(12) United States Patent
Ogata et al.

(10) Patent No.: US 8,869,811 B2
(45) Date of Patent: Oct. 28, 2014

(54) LIQUID PROCESSING APPARATUS AND LIQUID PROCESSING METHOD

(75) Inventors: Nobuhiro Ogata, Kumamoto (JP); Shuichi Nagamine, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 973 days.

(21) Appl. No.: 12/861,196

(22) Filed: Aug. 23, 2010

(65) Prior Publication Data

US 2011/0048469 A1 Mar. 3, 2011

(30) Foreign Application Priority Data

Aug. 27, 2009 (JP) .................................. 2009-196902
Jun. 16, 2010 (JP) .................................. 2010-137305

(51) Int. Cl.
| | | |
|---|---|---|
| B08B 3/02 | (2006.01) | |
| B08B 3/04 | (2006.01) | |
| B08B 13/00 | (2006.01) | |
| H01L 21/687 | (2006.01) | |
| B08B 11/02 | (2006.01) | |
| H01L 21/67 | (2006.01) | |

(52) U.S. Cl.
CPC ............ B08B 3/04 (2013.01); H01L 21/68728 (2013.01); B08B 11/02 (2013.01); H01L 21/67051 (2013.01); H01L 21/68742 (2013.01); H01L 21/68792 (2013.01)
USPC .......................................... 134/153; 134/117

(58) Field of Classification Search
CPC ... H01L 21/0209; H01L 21/68; H01L 21/683; H01L 21/68792; B08B 2203/00; B08B 11/02; B08B 3/04

USPC .................. 134/137, 145, 153, 164, 199, 902
See application file for complete search history.

(56) References Cited

U.S. PATENT DOCUMENTS 6,827,814 B2 * 12/2004 Taniyama et al. ......... 156/345.12
2010/0083986 A1 * 4/2010 Kamikawa et al. ............. 134/18

FOREIGN PATENT DOCUMENTS

| JP | 09-199456 A | 7/1997 |
|---|---|---|
| JP | 9-290197 A | 11/1997 |
| JP | 2009-60063 A | 3/2009 |
| WO | WO 2009084406 A1 * | 7/2009 |

* cited by examiner

*Primary Examiner* — Michael Kornakov
*Assistant Examiner* — Natasha Campbell
(74) *Attorney, Agent, or Firm* — Abelman, Frayne & Schwab

(57) ABSTRACT

Disclosed is a liquid processing apparatus and a liquid processing method that can prevent a processing liquid from being left on a lift pin after a drying-out process of a substrate, thereby preventing the processing liquid from being attached to the back surface of the substrate after the liquid processing. The liquid processing apparatus of the present disclosure includes a holding plate that supports a substrate, a lift pin plate provided above the holding plate having a lift pin that supports the wafer from a lower side, and a processing liquid supply unit that supplies the processing liquid to the back surface of the wafer. The processing liquid supply unit is provided with a head part configured to close a penetrating hole of the lift pin plate. The processing liquid supply unit and the lift pin plate are configured to be elevated with respect to the holding plate.

14 Claims, 10 Drawing Sheets

LIQUID PROCESSING APPARATUS AND LIQUID PROCESSING METHOD

This application is based on and claims priority from Japanese Patent Application No. 2009-196902, filed on Aug. 27, 2009 and Japanese Patent Application No. 2010-137305, filed on Jun. 16, 2010, with the Japanese Patent Office, the disclosures of which are incorporated herein in its entirety by reference.

TECHNICAL FIELD

The present disclosure relates to a liquid processing apparatus and a liquid processing method that perform a liquid processing such as a cleaning processing or an etching processing of a substrate by supplying the substrate with a processing liquid, while rotating the substrate that is held substantially horizontally.

BACKGROUND

A liquid processing apparatus has been known that performs a cleaning process of a substrate (hereinafter "wafer"), such as a semiconductor wafer and the like by supplying the substrate with a processing liquid, while rotating the substrate that is held substantially horizontally. For example, Japanese Patent Application Laid-open Publication No. heisei 09-290197 (hereinafter "Patent Document 1") discloses a liquid processing apparatus including a bottom plate for holding a wafer, a rotation shaft fixed and connected to the bottom plate and driven rotationally by a spin motor, a processing liquid supply tube extended within the rotation shaft for providing a processing liquid to a back surface of the wafer held by the bottom plate, and a substrate-push-up pin capable of supporting the wafer from a lower side by elevating the wafer. With such liquid processing apparatus, a penetrating hole for the processing liquid supply tube through which the processing liquid supply tube is passed, and a penetrating hole for the substrate-push-up pin through which the substrate-push-up pin is passed are provided at the bottom plate, respectively.

However, in the conventional liquid processing apparatus such as disclosed in the Patent Document 1, there is a possibility that the processing liquid, such as a chemical liquid or a rinsing liquid used for cleaning the wafer, may be attached to the substrate-push-up pin through the penetrating hole of the substrate-push-up pin provided at the bottom plate, which is being retreated downward from the bottom plate. Due to this, there has been a case that when the wafer is transferred to a carrying robot by elevating the wafer with the substrate-push-up pin after a drying process of the wafer, the droplet of the processing liquid attached to the substrate-push-up pin may be attached to the back surface of the wafer.

If the processing liquid is thus attached to the wafer, not only a watermark is formed at the wafer itself to which the droplet is attached, but also the humidity in a carrier into which the wafer is carried is increased, adversely affecting other wafers accommodated in the carrier as well.

SUMMARY

A liquid processing apparatus of the present disclosure includes a holding plate, formed with a penetrating hole at the center part thereof, configured to hold a substrate; a lift pin plate provided above the holding plate, formed with a penetrating hole in the center part thereof, and having a lift pin for supporting the substrate from a lower side; a rotation-driving unit configured to rotate the holding plate; a processing liquid supply unit configured to pass through the penetrating hole of the holding plate and the penetrating hole of the lift pin plate and to supply a processing liquid to the back surface of the substrate held by the holding plate, and have a head part provided to close the penetrating hole of the lift pin plate; and an elevating mechanism configured to relatively elevate the processing liquid supply unit and the lift pin plate relatively with respect to the holding plate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 2c is a top view showing the substrate cleaning apparatus of FIG. 2a, as seen from above, illustrating the state that a wafer is held by a substrate support unit and a retaining portion, as shown in FIG. 2a.

DETAILED DESCRIPTION

Figure 1:
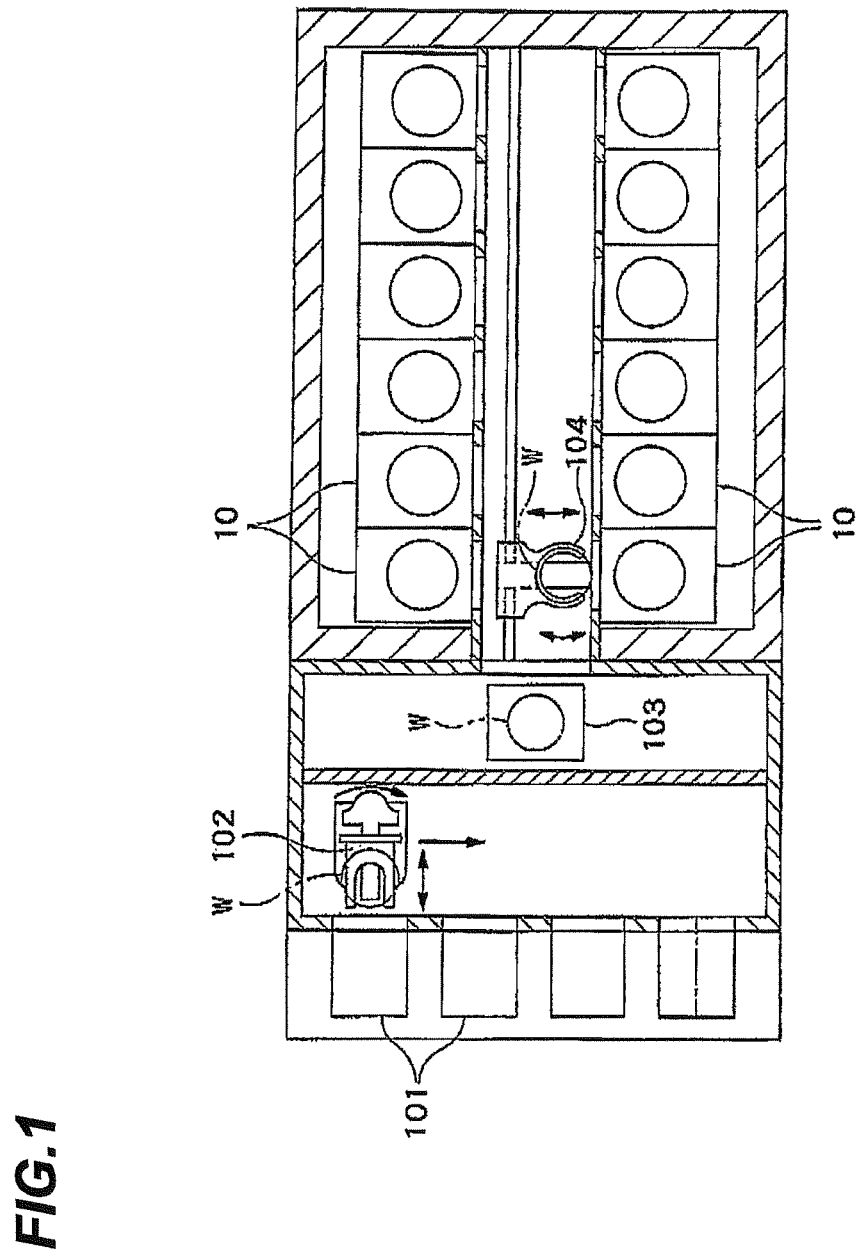
FIG. 1 is a top plane view showing a liquid processing system seen from above including a substrate cleaning apparatus, according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure has been made in view of the aforementioned problem described in the background, and is to provide a liquid processing apparatus and a liquid processing method that can prevent a processing liquid from being left to a lift pin after drying-out the wafer, thereby preventing the processing liquid from being attached to the back surface of the wafer after the liquid processing.

A liquid processing apparatus of the present disclosure includes a holding plate, formed with a penetrating hole at the center part thereof, configured to hold a substrate; a lift pin plate provided above the holding plate, formed with a penetrating hole in the center part thereof, and having a lift pin for supporting the substrate from a lower side; a rotation-driving unit configured to rotate the holding plate; a processing liquid supply unit configured to pass through the penetrating hole of the holding plate and the penetrating hole of the lift pin plate and to supply a processing liquid to the back surface of the substrate held by the holding plate, and have a head part to close the penetrating hole of the lift pin plate; and an elevating mechanism configured to relatively elevate the processing liquid supply unit and the lift pin plate with respect to the holding plate.

In the liquid processing apparatus of the present disclosure, the lift pin plate may be adapted to rotate coupled with the holding plate.

In the liquid processing apparatus of the present disclosure, the elevating mechanism may be adapted to elevate the processing liquid supply unit and the lift pin plate integrally.

Alternatively, the elevating mechanism may be adapted to elevate the processing liquid supply unit and the lift pin plate independently each other.

In the liquid processing apparatus of the present disclosure, the lift pin plate may be placed adjacent to the holding plate when the lift pin plate is at a lower position, and may be spaced upwardly from the holding plate when the lift pin plate is at an upper position, so as to transfer the substrate onto the lift pin and extract the substrate from the lift pin.

The liquid processing apparatus of the present disclosure may further include a rotation cup provided at the holding plate and surrounds the outer circumferential edge of the substrate held by the holding plate when the processing liquid supply unit and the lift pin are at the lower position.

In the liquid processing apparatus of the present disclosure, the holding plate may be provided with the substrate support portion configured to support the substrate from a side, and the substrate support portion may support the substrate from the side when the lift pin plate is at a lower position and be spaced from the substrate when the lift pin plate is at an upper position.

At this time, the substrate support portion may be configured to be pivotally supported to the holding plate, swing around a shaft, and have a substrate support part that supports the substrate from the side and a pressed part, being provided between the lift pin plate and the holding plate, to be pressed downwardly by the lower surface of the lift pin plate when the lift pin plate is at the lower position, and the substrate support portion may be such that the substrate support portion rotates around the shaft by allowing the lower surface of the lift pin plate to press the pressed part downwardly when the lift pin plate is moved from the upper position to the lower position and the substrate support part moves from the side of the substrate toward the substrate.

In this case, a shaft receiving portion formed with a bearing hole for receiving the shaft of the substrate support portion is provided at the holding plate, the shaft is capable of moving horizontally along the shaft receiving hole, and a pressing portion for pressing the shaft toward the center of the holding plate may be provided at the shaft. Here, the pressing portion may be a spring member.

In the liquid processing apparatus of the present disclosure, the lower surface of the lift pin plate may be provided with a connecting member extended downwardly from the lift pin plate, the holding plate may be provided with a penetrating hole for the connecting member through which the connecting member is passed, the lift pin plate and the holding plate may rotate coupled with the connecting member, and the elevating mechanism may elevate the connecting member upwardly when the lift pin plate is moved from the lower position to the upper position.

At this time, a hollow housing member, being extended downwardly from the holding plate, may be provided for accommodating the connecting member at the lower surface of the holding plate, a spring connected to the connecting member may be accommodated with being pressed at a hollow area of the housing member, and the connecting member may be biased downwardly by the spring.

A liquid processing method of the present disclosure cleans a substrate by means of a liquid processing apparatus which includes a holding plate, formed with a penetrating hole at the center part thereof, configured to hold a substrate; a lift pin plate provided above the holding plate, formed with a penetrating hole in the center part thereof, and having a lift pin for supporting the substrate from a lower side; a rotation-driving unit configured to rotate the holding plate; and a processing liquid supply unit configured to pass through the penetrating hole of the holding plate and the penetrating hole of the lift pin plate and to supply a processing liquid to the back surface of the substrate held by the holding plate, and have a head part provided to close the penetrating hole of the lift pin plate, and an elevating mechanism configured to relatively elevate the processing liquid supply unit and the lift pin plate with respect to the holding plate. The liquid processing method includes steps of disposing the substrate onto the lift pin of the lift pin plate in a state that each of the processing liquid supply unit and the lift pin plate is placed to an upper position; moving each of the processing liquid supply unit and the lift pin plate from the upper position to a lower position; supplying the processing liquid to the back surface of the wafer held by the holding plate by the processing liquid supply unit in a state that each of the processing liquid supply unit and the lift pin plate is placed to the lower position; moving each of the processing liquid supply unit and the lift pin plate from the lower position to the upper position; extracting the substrate supported by the lift pin in a state that each of the processing liquid supply unit and the lift pin plate are placed at the upper position.

According to the liquid processing apparatus and the liquid processing method of the present disclosure, it is possible to prevent the processing liquid from being left at the lift pin after drying-out the substrate, thereby preventing the processing liquid from being attached to the back surface of the substrate after the liquid processing.

Figure 2A:
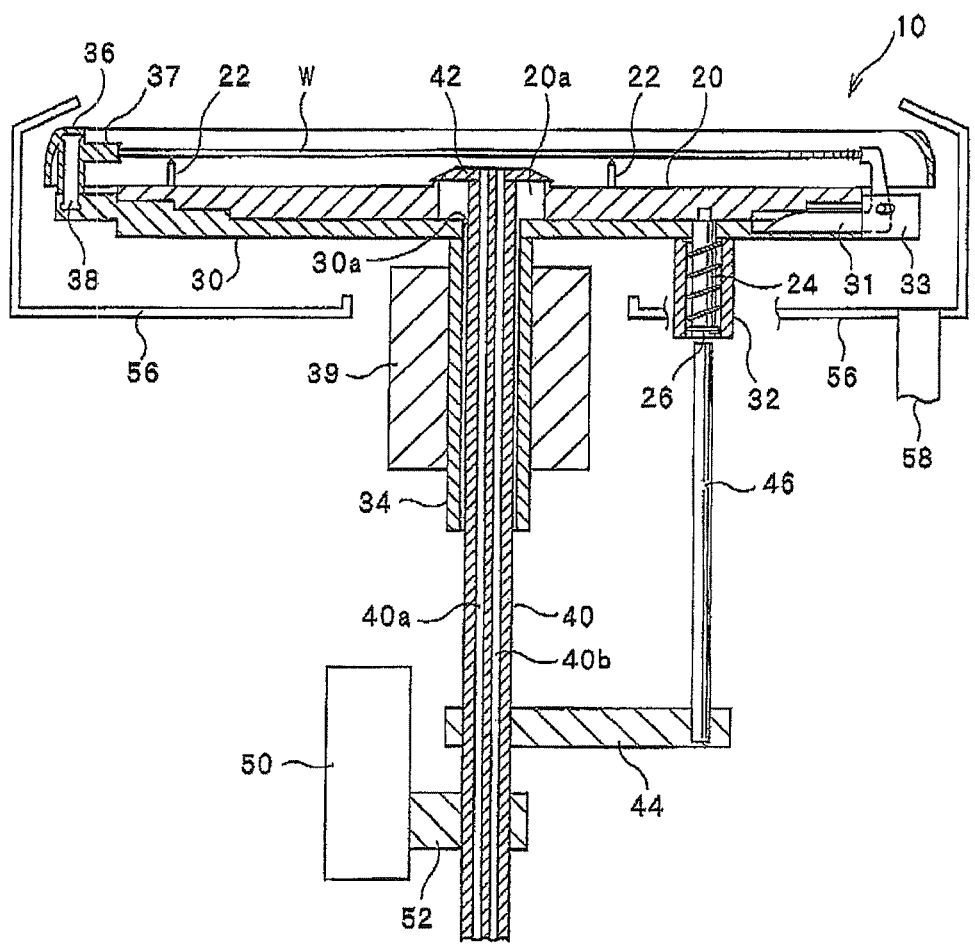
FIG. 2a is a vertical cross-sectional view showing the configuration of a substrate cleaning apparatus according to an embodiment of the present disclosure, and illustrates the state where a lift pin plate and a cleaning liquid supply tube are at the lower position.
Figure 2B:
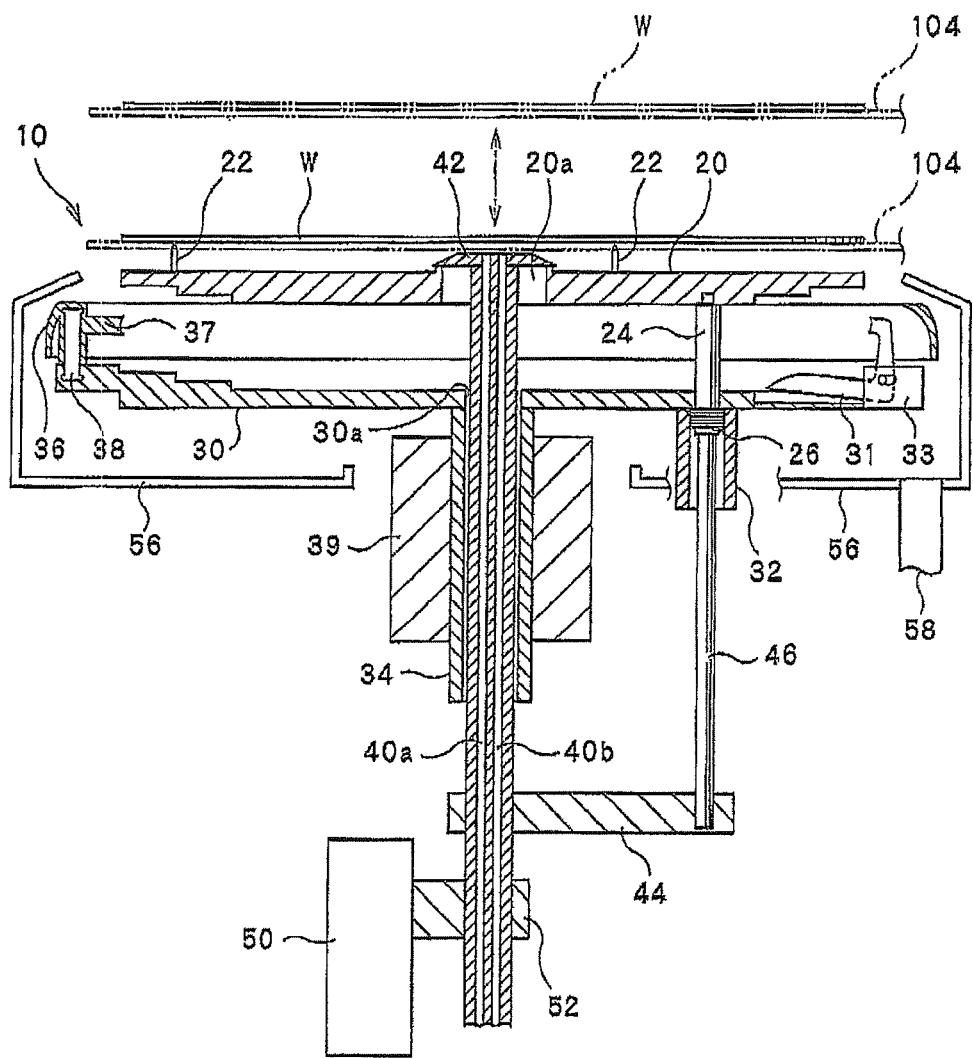
FIG. 2b is a vertical cross-sectional view showing the configuration of a substrate cleaning apparatus according to an embodiment of the present disclosure, and illustrates the state where the lift pin plate and the cleaning liquid supply tube are at the upper position.
Figure 2C:
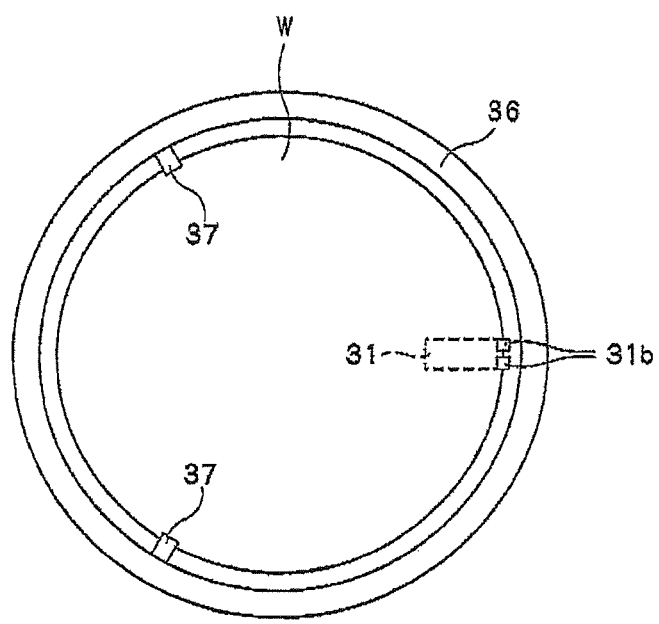
Figure 3:
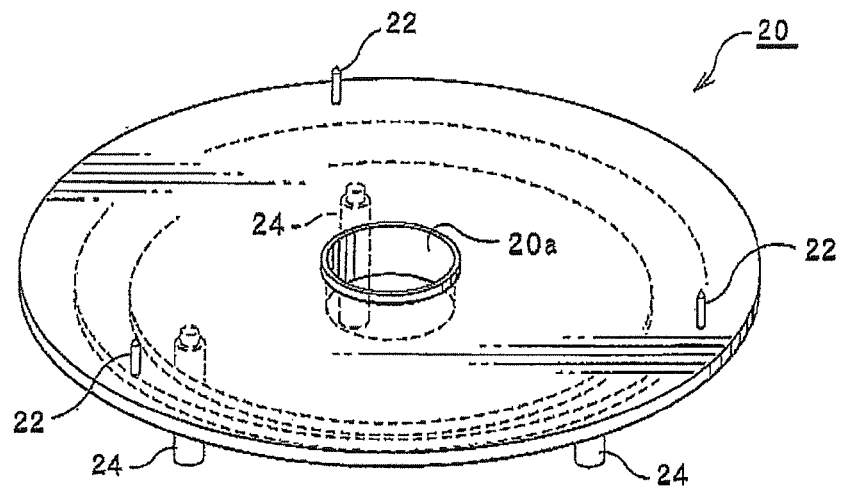
FIG. 3 is a perspective view showing the configuration of the lift pin plate of the substrate cleaning apparatus shown in the FIGS. 2a and 2b.
Figure 4:
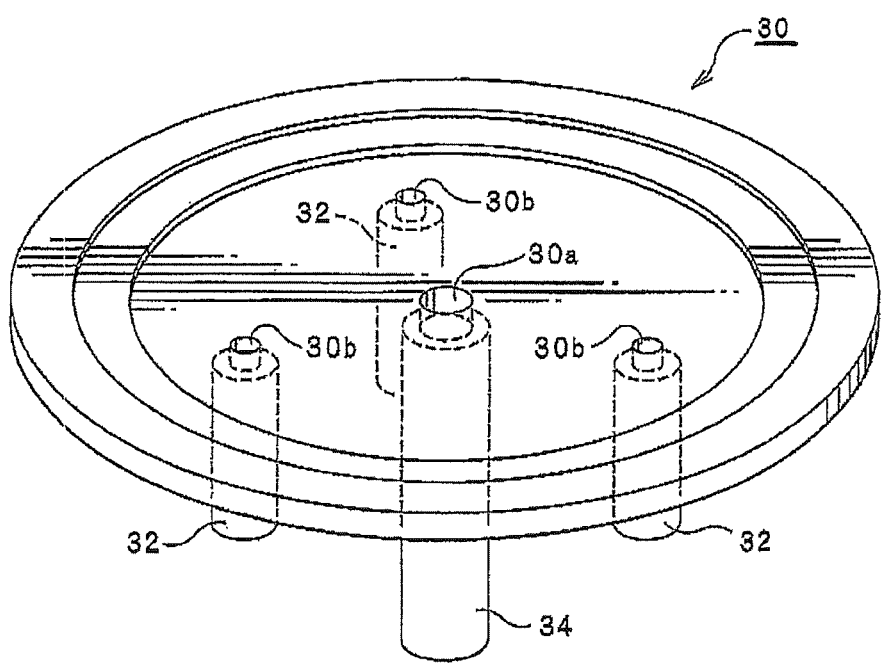
FIG. 4 is a perspective view showing the configuration of a holding plate of the substrate cleaning apparatus shown in the FIGS. 2a and 2b.
Figure 5:
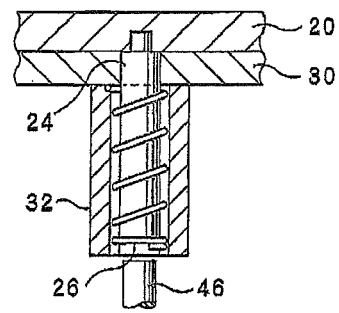
FIG. 5 is an enlarged vertical cross-sectional view showing in detail the configuration of a connecting member extended downwardly from the lift pin plate, and a hollow housing member extended downwardly from the holding plate for accommodating the connecting member in the substrate cleaning apparatus shown in FIGS. 2a and 2b.
Figure 6:
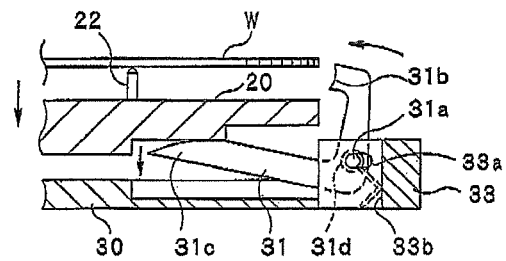
FIG. 6 is an enlarged vertical cross-sectional view showing the configuration of a substrate support portion provided in the holding plate of the substrate cleaning apparatus shown in the FIGS. 2a and 2b.
Figure 7:
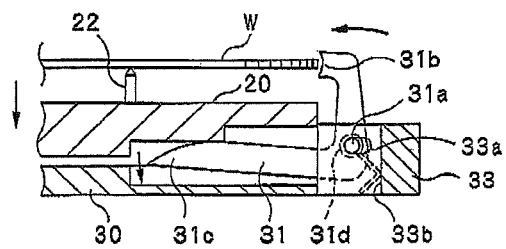
FIG. 7 is an enlarged vertical cross-sectional view showing the state where the lift pin plate has been moved downwardly from the state shown in FIG. 6.
Figure 8:
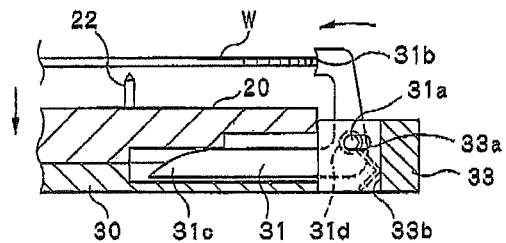
FIG. 8 is an enlarged vertical cross-sectional view showing the state where the lift pin plate has been further moved downwardly from the state shown in FIG. 7.
Figure 9:
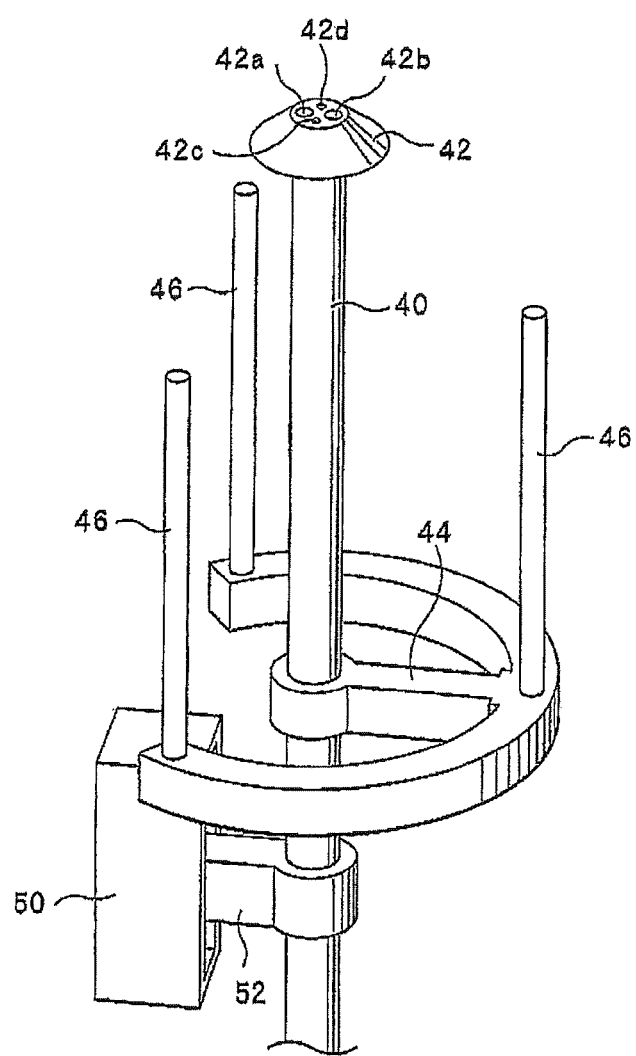
FIG. 9 is a perspective view showing the configuration of a cleaning liquid supply tube and an elevating mechanism for elevating the cleaning liquid supply tube in the substrate cleaning apparatus shown in the FIGS. 2a and 2b.
Figure 10:
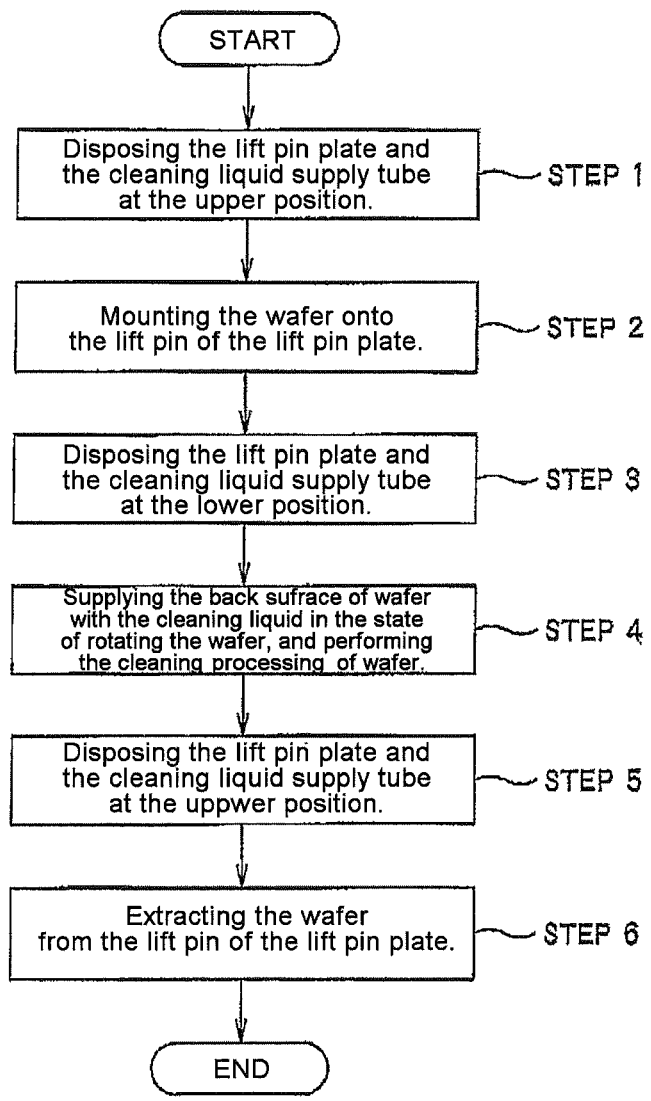
FIG. 10 is a flow diagram showing the steps of a substrate cleaning method according to an embodiment of the present disclosure.

Hereinafter, an embodiment of the present disclosure will be described with reference to the drawings. FIGS. 1 to 10 are drawings showing the substrate cleaning apparatus according to the present embodiment. In particular, FIG. 1 is a top plane view showing a liquid processing system including a substrate cleaning apparatus, as seen from above, according to an embodiment of the present disclosure. Also, FIGS. 2a and 2b are vertical cross-sectional views showing the configuration of the substrate cleaning apparatus in the present embodiment, and FIG. 2c is a top view of the substrate cleaning apparatus of FIG. 2a, as seen from above, illustrating the state that a wafer is held by a substrate support unit and a retaining portion as shown in FIG. 2a. Also, FIG. 3 is a perspective view showing the configuration of the lift pin plate of the substrate cleaning apparatus shown in FIGS. 2a and 2b, and FIG. 4 is a perspective view showing the configuration of the holding plate of the substrate cleaning apparatus shown in FIGS. 2a and 2b. Moreover, FIG. 5 is an enlarged vertical cross-sectional view showing in detail the configuration of a connecting member extended downwardly from the lift pin plate, and a hollow housing member, extended downwardly from the holding plate, for accommodating the connecting member in the substrate cleaning apparatus shown in FIGS. 2a and 2b. Moreover, FIGS. 6 to 8 are an enlarged vertical cross-sectional view showing the configuration of a substrate support portion provided in the holding plate in the substrate cleaning apparatus shown in FIGS. 2a and 2b. Moreover, FIG. 9 is a perspective view showing the configuration of a cleaning liquid supply tube and an elevating mechanism that elevates the cleaning liquid supply tube in the substrate cleaning apparatus shown in FIGS. 2a and 2b. Moreover, FIG. 10 is a flow diagram showing the steps of a substrate cleaning method according to an embodiment of the present disclosure.

First, the liquid processing system including a substrate cleaning apparatus according to the present embodiment will be described with reference to FIG. 1. As shown in FIG. 1, the liquid processing system includes a mount table 101 for mounting a carrier that receives a substrate W from outside. The substrate W may be a semiconductor wafer (hereinafter wafer W) and the like which is an object to be processed; a transfer arm 102 for extracting wafer W received at the carrier; a shelf unit 103 for mounting wafer W extracted by transfer arm 102; a transfer arm 104 for taking out wafer W mounted at shelf unit 103 and transferring wafer W into a substrate cleaning apparatus 10. As shown in FIG. 1, a plurality of substrate cleaning apparatuses 10 (twelve in the aspect shown in FIG. 1) are incorporated in the liquid processing system. Also, as shown in FIG. 1, transfer arm 104 is generally a U-shape, as seen from above, and is shaped such that when wafer W is disposed/extracted on/from a lift pin 22 (will be described later), transfer arm 104 is not in contact with lift pin 22.

Next, the schematic configuration of substrate cleaning apparatus 10 according to the present embodiment will be described with reference to FIGS. 2a and 2b. Substrate cleaning apparatus 10 includes a holding plate 30 for holding wafer W; a lift pin plate 20, provided above holding plate 30, having a lift pin 22 for supporting wafer W from a lower side; a rotation-driving unit 39 for rotating holding plate 30; and a cleaning liquid supply tube 40 configured to pass through a penetrating hole 30a provided at the center part of holding plate 30 and a penetrating hole 20a provided at the center part of lift pin plate 20, and to supply the cleaning liquid such as deionized water or chemical liquid to the back surface of wafer W held by holding plate 30. Lift pin plate 20 is adapted to rotate coupled with holding plate 30. Cleaning liquid supply tube 40 is provided with a head part 42 configured to close penetrating hole 20a of lift pin plate 20.

Each of lift pin plate 20 and cleaning liquid supply tube 40 is adapted to elevate with respect to holding plate 30. Here, FIG. 2a is a view showing the state where lift pin plate 20 and cleaning liquid supply tube 40 are at the lower position, respectively, and FIG. 2b is a view showing the state where lift pin plate 20 and cleaning liquid supply tube 40 are at the upper position, respectively. Each of lift pin plate 20 and cleaning liquid supply tube 40 is adapted to elevate between the lower position as shown in FIG. 2a and the upper position as shown in FIG. 2b.

Further, as to wafer W to which substrate cleaning apparatus 10 performs a cleaning processing, all wafers W may not be the same size, and there may be instances where there is a tolerance in the size for each wafer W.

Next, individual components of substrate cleaning apparatus 10 including above configuration will be described in detail hereinafter.

As shown in FIG. 3, lift pin plate 20 is disk-shaped and formed with penetrating hole 20a in the center part thereof. Cleaning liquid supply tube 40 is passed through penetrating hole 20a. Also, the surface of lift pin plate 20 is provided with three lift pins 22. These lift pins 22 are provided equally spaced along the circumferential direction around the peripheral portion of lift pin plate 20. Also, the back surface of lift pin plate 20 (the opposite surface to the surface in which each lift pin 22 is provided) is provided with three rod-shaped connecting members 24. The respective connecting member 24 is extended downwardly from the back surface of lift pin plate 20. These connecting members 24 are provided equally spaced along the circumferential direction around the peripheral portion of lift pin plate 20.

As shown in FIG. 4, holding plate 30 is disk-shaped and formed with penetrating hole 30a in the center part thereof. Cleaning liquid supply tube 40 is passed through penetrating hole 30a. Also, on the surface of holding plate 30, a rotation cup 36 is attached with a connecting member 38 being sandwiched. Rotation cup 36, as shown in FIG. 2a, is adapted to surround the outer peripheral edge of wafer W held by holding plate 30 when lift pin plate 20 and cleaning liquid supply tube 40 are at the lower position. Also, as shown in FIG. 2a or 2c, two retaining portions 37 are provided on rotation cup 36 for holding wafer W. The specific function of the retaining portions 37 will be described later. Also, retaining portions 37 may be provided on holding plate 30 instead of on rotation cup 36, or be connected directly to connecting member 38. In case that retaining portion 37 is connected directly to connecting member 38, the strength of retaining portion 37 over the force of the horizontal direction may be increased.

Also, at the center part of the back surface of holding plate 30 (the opposite side surface to the surface on which rotation cup 36 is provided), a hollow rotation shaft 34 is attached extending downwardly from the back surface of holding plate 30. Cleaning liquid supply tube 40 is accommodated at the hollow area of rotation shaft 34. Also, rotation shaft 34 is configured to rotate by means of rotation drive unit 39 with a bearing (not shown) and the like being sandwiched between rotation shaft 34 and rotation drive unit 39. Rotation drive unit 39 rotates rotation shaft 34, thereby rotating holding plate 30 as well.

Also, as shown in FIG. 4, three penetrating holes (each corresponding to a penetrating hole for the connecting member 30b) are provided through which the respective rod-shaped connecting member 24, extending downwardly from the back surface of lift pin plate 20, is passed. Each penetrating hole 30b is equally spaced along the circumferential direction at holding plate 30. Also, at the back surface of holding plate 30, three cylindrical housing members 32 are provided at the position of the respective penetrating hole 30b. Each housing member 32 is adapted to extend downwardly from the back surface of holding plate 30, and to accommodate each connecting member 24 extending downwardly from the back surface of lift pin plate 20. Each of housing members 32 is spaced equally along the circumferential direction near the peripheral portion of holding plate 30.

Each connecting member 24 extending downwardly from the back surface of lift pin plate 20 and each housing member 32 extending downwardly from the back surface of holding plate 30 will be described in detail with reference to FIG. 5. As shown in FIG. 5, the inner diameter of each cylindrical housing member 32 is slightly larger than the outer diameter of the respective connecting member 24, so that the respective connecting member 24 is able to move within the respective housing member 32 along longitudinal direction of the respective housing member 32 (up-and-down direction in FIG. 5). As shown in FIG. 2a, each connecting member 24 is accommodated completely in the respective housing member 32, when lift pin plate 20 is at the lower position. In contrast, as shown in FIG. 2b, when lift pin plate 20 is at the upper position, the respective connecting member 24 is such that only the bottom part thereof is accommodated in the respective housing member 32, and the respective connecting member 24 passes through penetrating hole 30b provided at holding plate 30, thereby protruding upwardly from holding plate 30. As such, when lift pin plate 20 is at the lower position, the respective connecting member 24 is accommodated completely in the respective housing member 32, thus allowing lift pin plate 20 to rotate as well coupled with the respective connecting member 24 on rotating holding plate 30.

As shown in FIG. 5, spring 32 is accommodated in the hollow area of the respective housing member 32 in a compressed state. Spring 26 is such that the lower edge thereof is attached to the lower edge portion of connecting member 24 and the upper edge thereof is attached to the lower surface of holding plate 30 near penetrating hole 30b. Therefore, connecting member 24 is biased downwardly by spring 26. That is, a downward force (force intended to move downwardly from holding plate 30) is always applied to connecting member 24 due to the force of spring 26 intended to restore from the compressed state to the original state.

As shown in FIGS. 2a and 2b, an outer cup 56 is provided outside rotation cup 36, and holding plate 30 and rotation cup 36 are covered by outer cup 56. A liquid discharge tube 58 is connected to outer cup 56, and the cleaning liquid, used for cleaning wafer W, scattered outside wafer W by the rotation of wafer W and received by outer cup 56, is discharged through liquid discharge tube 58.

As shown in, for example, FIG. 2a, holding plate 30 is provided with substrate support portion 31 for supporting wafer W from the side. Substrate support portion 31 supports wafer W from the side when lift pin plate 20 is at the lower position as shown in FIG. 2a, whereas substrate support portion 31 is spaced from wafer W when lift pin plate 20 is at the upper position as shown in FIG. 2b. More particularly, as shown in FIG. 2c, when the cleaning processing of wafer W is performed, wafer W is held by substrate support portion 31 and two retaining portions 37. At this time, substrate support portion 31 pushes wafer W toward retaining portion 37. That is, the force is applied toward the left direction in FIG. 2c with respect to wafer W by substrate support portion 31 in FIG. 2c, so that wafer W is pushed and attached to two retaining portions 37. Thus, in case wafer W is supported from the side using both of substrate support portion 31 and retaining portion 37, wafer W may be supported with a simpler set up because only one moving member (retreating member) can be used, as compared to the case that wafer W is supported from the side using a plurality of substrate support portions 31, without using retaining portion 37.

The configuration of substrate support portion 31 will be described in detail with reference to FIGS. 6 to 8.

FIG. 6 illustrates the middle state where lift pin plate 20 is moving from the upper position as shown in FIG. 2b toward the lower position as shown in FIG. 2a, FIG. 7 illustrates the state when lift pin plate 20 is moved downwardly from the state shown in FIG. 6, and FIG. 8 is a view where lift pin plate 20 is further moved downwardly from the state shown in FIG. 6, resulting in reaching to the lower position as shown in FIG. 2a.

As shown in FIGS. 6 to 8, substrate support portion 31 is pivotally supported to holding plate 30 through shaft 31a. More particularly, as shown in FIGS. 6 to 8, a shaft receiving portion 33 is attached to holding plate 30, and shaft 31a is adapted to be received at a shaft receiving hole 33a provided in shaft receiving portion 33. Shaft receiving hole 33a is formed with a thin and vertically long hole extending horizontally, and shaft 31a of substrate support portion 31 is capable of moving horizontally along shaft receiving hole 33a. Thus, substrate support portion 31 is configured to swing around shaft 31a received at shaft receiving hole 33a of shaft receiving portion 33.

Also, a spring member 31d (e.g., a torsion spring) is wound to shaft 31a of substrate support portion 31. Spring member 31d is such that the force that rotates substrate support portion 31 around shaft 31a clockwise in FIGS. 6 to 8 is applied to substrate support portion 31. Accordingly, in case no force is applied to substrate support portion 31, as shown in FIG. 2b, substrate support portion 31 is inclined with respect to holding plate 30, and a substrate support part 31b (will be described later) of substrate support portion 31 for supporting wafer W from the side is becoming remote from the center of holding plate 30.

Also, a linear part is extended from spring member 31d wounded to shaft 31a, and the linear part is fixed to the inner wall surface 33b of shaft receiving portion 33, allowing shaft 31 to be pushed toward the center of holding plate 30. Accordingly, shaft 31a is adapted to always be pressed toward the center of holding plate 30 (e.g., toward the left direction in FIGS. 6 to 8) by the linear part of spring member 31d. On this account, in case wafer W having a relatively small diameter is supported by substrate support portion 31 and retaining portion 37, shaft 31a is disposed to the position close to the center of holding plate 30 in shaft receiving hole 33a (e.g., the left position in FIGS. 6 to 8), as shown in FIGS. 6 to 8. On the other hand, in case wafer W with a relatively large diameter is supported by substrate support portion 31 and retaining portion 37, shaft 31a is moved to the right direction from the position shown in, for example, FIG. 6 along shaft receiving hole 33a against the force by the linear part of spring member 31d.

Additionally, substrate support portion 31 includes a substrate support part 31b for supporting wafer W from the side, and a pressed member 31c provided at the opposite side to substrate support part 31b with respect to shaft 31a. Pressed member 31c is provided between lift pin plate 20 and holding plate 30, and is pressed toward the downward direction by the lower surface of lift pin plate 20 when lift pin plate 20 is at the lower position or near the lower position, as shown in FIGS. 6 to 8.

As shown in FIGS. 6 to 8, substrate support portion 31 rotates along the counterclockwise direction (an arrow direction in FIG. 6 and the like) shown in, for example, FIG. 6 around shaft 31a by allowing pressed member 31c to be pressed downwardly by the lower surface of lift pin plate 20, when lift pin plate 20 is moved from the upper position to the lower position. Also, substrate support portion 31 rotates around shaft 31a so that substrate support part 31b moves from the side of wafer W toward wafer W. With this feature, wafer W is supported by substrate support portion 31 from the side as shown in FIG. 8 when lift pin plate 20 reaches the lower position. Here, as shown in FIG. 8, when wafer W is supported from the side by substrate support portion 31, wafer W is spaced upwardly from the front end of lift pin 22, thereby floating above lift pin 22. Also, as noted above, depending on the size of wafer W, shaft 31a may be moved to the right direction from the position shown in, for example, FIG. 6 along shaft receiving hole 33a against the force applied by the linear part of spring member 31d. Accordingly, even if a relatively large wafer W is supported by substrate support portion 31 and retaining portion 37, wafer W may be supported from the side without being distorted or damaged because substrate support portion 31 is adapted to be capable of moving horizontally.

It is not necessary to provide a driving mechanism for driving substrate support portion 31 by providing substrate support portion 31 with substrate cleaning apparatus 10 as discussed above, and the constitution of substrate cleaning apparatus 10 may be simpler because substrate support portion 31, lift pin plate 20 and cleaning liquid supply tube 40 may be driven by coupling with the elevating operation of lift pin plate 20 through an elevating driving portion 50 which will be described later. Also, it may be possible to suppress the occurrence of time lag between the elevating timing of lift pin plate 20 and the moving timing of substrate support portion 31, thereby improving the throughput.

As shown in FIGS. 2a and 2b, cleaning liquid supply tube 40 is provided to pass through each of penetrating hole 20a of lift pin plate 20 and penetrating hole 30a of holding plate 30. Cleaning liquid supply tube 40 is configured not to rotate even if lift pin plate 20 or holding plate 30 rotates. One or a plurality of cleaning liquid supply path(s) is (are) provided within cleaning liquid supply tube 40 for allowing, for example, deioniziled water or chemical liquid to be passed through. Though FIGS. 2a and 2b show a view where two cleaning liquid supply paths 40a, 40b are provided within cleaning liquid supply tube 40, in fact, for example, four cleaning liquid supply paths are provided within cleaning liquid supply tube 40. As shown in FIG. 9, head part 42 is provided at the front end of cleaning liquid supply tube 40. Head part 42 has a similar shape to a disk. Also, head part 42 is configured to close penetrating hole 20a of lift pin plate 20. Head part 42 is provided with one or a plurality of nozzles. FIG. 9 shows a view where head part 42 is provided with four nozzles 42a to 42d. Each nozzle provided at head part 42 is adapted to communicate with the respective cleaning liquid supply path provided within cleaning liquid supply tube 40, allowing, for example, deionized water or chemical liquid delivered to the respective nozzle through the respective cleaning liquid supply path to be sprayed toward the back surface of wafer W from the nozzle. The cleaning liquid supply tube may be provided with a gas supply path through which gas such as N2 gas is passed through in addition to cleaning liquid supply path through which, for example, deionized water or chemical liquid are passed. Alternatively, gas and the cleaning liquid may be delivered through the same cleaning liquid supply path of the cleaning liquid supply tube.

In this case, the gas is sprayed to wafer W from the corresponding nozzle of the head part, after delivered to the gas supply path or the cleaning liquid supply path of the cleaning liquid supply tube.

As shown in FIGS. 2a, 2b and 9, elevating driving portion 50 is provided at cleaning liquid supply tube 40 sandwiching connecting member 52 with cleaning liquid supply tube 40. Elevating driving portion 50 is configured to elevate cleaning liquid supply tube 40 by elevating connecting member 52 which is connected to cleaning liquid supply tube 40. More particularly, elevating driving portion 50 elevates cleaning liquid supply tube 40 between the lower position as shown in FIG. 2a and the upper position as shown in FIG. 2b.

Also, as shown in FIG. 9, a first coupling member 44 is connected to cleaning liquid supply tube 40. Also, three rod-shaped second coupling members 46 are connected to first coupling member 44 extending upwardly from first coupling member 44. Here, each second coupling member 46 is provided corresponding to the respective connecting member 24 each extended downwardly from the back surface of lift pin plate 20, and the outer diameter of the respective rod-shaped second coupling member 46 is made smaller than the inner diameter of the cylindrical housing member 32. More particularly, each second coupling member 46 is provided to contact the bottom surface of the respective connecting member 24, and each second coupling member 46 is adapted to push the respective connecting member 24 upwardly within the respective housing member 32, as shown in, for example, FIG. 2b.

That is, in the state as shown in FIG. 2a, when elevating driving portion 50 moves cleaning liquid supply tube 40 upwardly, each of the respective first coupling member 44 and second coupling member 46 connected to cleaning liquid supply tube 40 also move upwardly, and the respective coupling member 46 elevates the respective connecting member 24 upwardly within the respective housing member 32. As a result, lift pin plate 20 also moves upwardly along with cleaning liquid supply tube 40, and as shown in FIG. 2b, each of lift pin plate 20 and cleaning liquid supply tube 40 reach the upper position. In contrast, in the state as shown in FIG. 2b, when elevating driving portion 50 moves cleaning liquid supply tube 40 downwardly, since the downward force is always applied to connecting member 24 by the force of spring 26 provided at housing member 32, the back surface of the respective connecting member 24 also moves downwardly to contact the upper end of the respective second interworking member 46 when the respective second coupling member 46 moves downwardly. Thus, as shown in FIG. 2a, each of lift pin plate 20 and cleaning liquid supply tube 40 reach the lower position.

As shown in FIG. 2a, lift pin plate 20 is placed adjacent to holding plate 30 when in the lower position. On the other hand, as shown in FIG. 2b, lift pin plate 20 is spaced upwardly from holding plate 30 when in the upper position, allowing wafer W to be delivered onto lift pin 22 and removed from lift pin 22.

As such, a coupling mechanism is provided to elevate lift pin plate 20 and cleaning liquid supply tube 40 integrally by means of first coupling member 44 along with three second coupling members 46. Also, an elevating mechanism is provided to relatively elevate lift pin plate 20 and cleaning liquid supply tube 40 with respect to holding plate 30 by means of first coupling member 44, three second coupling members 46, elevating driving portion 50 and connecting member 52.

Next, the operation of substrate cleaning apparatus 10 including above compositions will be described with reference to the flow chart as shown in FIG. 10.

At step 1 of FIG. 10, lift pin plate 20 and cleaning liquid supply tube 40 are disposed to the upper position as shown in FIG. 2b by the elevating mechanism. At step 2, as shown with two dot chain lines in FIG. 2b, wafer W is transferred to substrate cleaning apparatus 10 from the outside of substrate cleaning apparatus 10 by transfer arm 104, and then disposed onto lift pin 22 of lift pin plate 20.

At step 3 of FIG. 10, elevating driving portion 50 moves cleaning liquid supply tube 40 from the upper position to the lower position. At this time, since the downward force is always applied to connecting member 24 by the force of spring 26 provided within housing member 32, lift pin plate 20 also moves downwardly by the coupling with the downward movement of cleaning liquid supply tube 40, and lift pin plate 20 moves from the upper position to the lower position. Also, pressed part 31c of substrate support portion 31 is pressed downwardly from the state as shown in FIG. 6 by the lower surface of lift pin plate 20, thereby allowing substrate support portion 31 to rotate counterclockwise of FIG. 6 around shaft 31a. Accordingly, substrate support part 31b of substrate support portion 31 rotates toward wafer W from the side of wafer W (see FIG. 7), and wafer W is supported from the side by substrate support portion 31 (see FIG. 8). At this time, wafer W supported from the side by substrate support portion 31 is spaced upwardly from lift pin 22.

After lift pin plate 20 and cleaning liquid supply tube 40 reach the lower position as shown in FIG. 2a, holding plate 30 is rotated by rotation driving unit 39. At this time, since the respective connecting member 24 provided to extend downwardly from the back surface of pin plate 20 is accommodated in the respective housing member 32 provided to extend downwardly from the back surface of holding plate 30, lift pin plate 20 and wafer W also rotate in coupling when holding plate 30 rotates. At this time, cleaning liquid supply tube 40 does not rotate and stands still.

At step 4 of FIG. 10, a cleaning liquid such as, for example, deionized water or chemical liquid is supplied toward the back surface of wafer W from cleaning liquid supply tube 40 in the state wafer W rotates, thereby performing a cleaning process of wafer W. Specifically, the chemical liquid is supplied toward the back surface of wafer W first from cleaning liquid supply tube 40 to perform a chemical liquid process of wafer W, and then deionized water is then supplied toward the back surface of wafer W from cleaning liquid supply tube 40 to perform a rinse process of wafer W.

When the cleaning process of wafer W is completed, the dry-out process of wafer W is performed by further rotating wafer W. Then, elevating driving portion 50 moves cleaning liquid supply tube 40 from the lower position to the upper position. At step 5 of FIG. 10, the respective coupling member 46 pushes the respective connecting member 24 upwardly, so that lift pin plate 20 also moves upwardly in coupling with the upward movement of cleaning liquid supply tube 40, and lift pin plate 20 moves from the lower position to the upper position. Also, at this time, substrate support portion 31 rotates along the counterclockwise direction of FIG. 6 (opposite direction to the arrow of FIG. 6) around shaft 31a by the deflecting force of spring member 31d with respect to substrate support portion 31. As a result, substrate support portion 31 is spaced from wafer W to the side. Since substrate support portion 31 is spaced from wafer W to the side, wafer W is supported from its back surface by lift pin 22.

At step 6 of FIG. 10, after lift pin plate 20 and cleaning liquid supply tube 40 reach the upper position as shown in FIG. 2b, wafer W disposed on lift pin 22 is extracted from lift pin 22 by transfer arm 104. Wafer W extracted by transfer arm 104 is transferred to the outside of substrate cleaning apparatus 10. Thus, a series of cleaning processing of wafer W is completed.

According to substrate cleaning apparatus 10 and substrate cleaning method as discussed above, lift pin plate 20 and cleaning liquid supply tube 40 are elevated relatively with respect to holding plate 30, and lift pin 22 for supporting wafer W from the lower direction is provided in lift pin plate 20. In addition, head part 42 for closing penetrating hole 20a of lift pin plate 20 is provided at cleaning liquid supply tube 40. Thus, penetrating hole 20a of lift pin plate 20 through which cleaning liquid supply tube 40 is passed, is closed by head part 42 provided at cleaning liquid supply tube 40, thereby preventing the cleaning liquid from entering penetrating hole 20a. Also, compared with the case where the penetrating hole through which lift pin 22 is passed, is formed on a bottom plate and lift pin 22 passes though the penetrating hole to retreat downwardly of the bottom plate as in the conventional art, the cleaning liquid is not left in lift pin 22 after drying-out wafer W since lift pin plate 20 is provided at lift pin 22, thus preventing the cleaning liquid from being attached to the back surface of wafer W after the cleaning process. That is because lift pin 22 rotates integrally with lift pin plate 20 at the time of drying-out wafer W. Also, according to substrate cleaning apparatus 10 of the present embodiment, it is possible to prevent the droplet of the cleaning liquid from being left to lift pin 22 by allowing lift pin 22 to rotate integrally with lift pin plate 20, thereby preventing the droplet of the cleaning liquid more efficiently from being left to the back surface of wafer W after the cleaning process.

Also, in substrate cleaning apparatus 10 of the present embodiment, since cleaning liquid supply tube 40 and lift pin plate 20 are elevated integrally, head part 42 always closes penetrating hole 20a of lift pin plate 20 when cleaning liquid supply tube 40 or lift pin plate 20 elevates, thereby preventing the cleaning liquid from entering penetrating hole 20a more efficiently.

Also, with substrate cleaning apparatus 10 of the present embodiment, holding plate 30 is provided with rotation cup 36, thereby preventing the cleaning liquid from being scattered from rotating wafer W to the outside while performing the cleaning processing of wafer W. Also, since holding plate 30 is provided with substrate support portion 31, wafer W is supported from the side while rotating wafer W so that wafer W is supported more stably.

The substrate cleaning apparatus according to the present embodiment is not limited to the above aspects, and various changes can be made therein.

For example, lift pin plate 20 and cleaning liquid supply tube 40 may be adapted to elevate separately instead of elevating integrally. For example, a lift pin plate elevating driving portion for elevating lift pin plate 20 may be provided independent of elevating driving portion 50.

Figure 11:
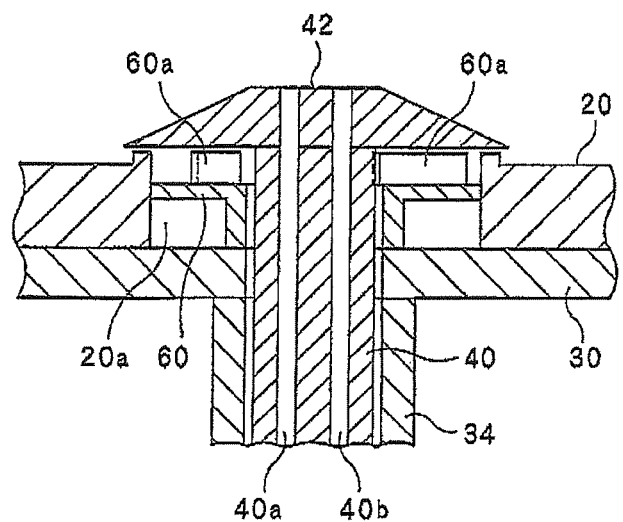
FIG. 11 is a vertical cross-sectional view showing the configuration of a modified substrate cleaning apparatus provided with a fin member around the cleaning liquid supply tube at a penetrating hole of the lift pin plate.
Figure 12:
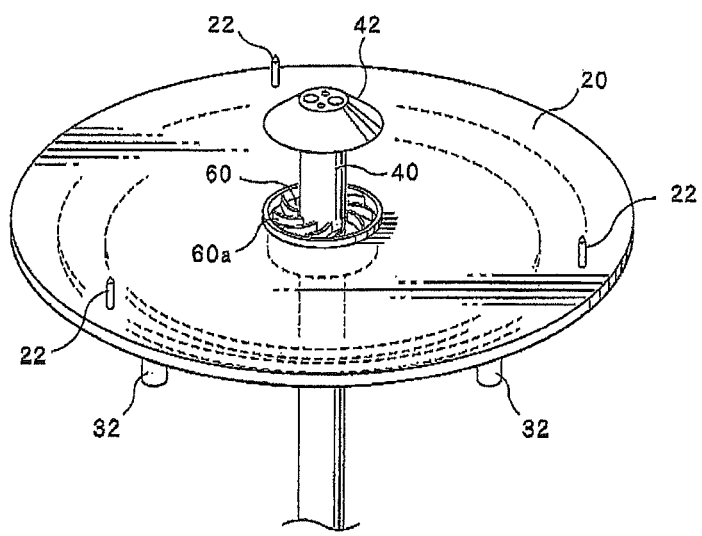
FIG. 12 is a perspective view showing a part of the modified substrate cleaning apparatus shown in FIG. 11.

Also, with the substrate cleaning apparatus, a fin member 60 may be provided around cleaning liquid supply tube 40 in penetrating hole 20a of lift pin plate 20. Such substrate cleaning apparatus will be described with reference to FIGS. 11 and 12. FIG. 11 is a vertical cross-sectional view showing the configuration of a modified substrate cleaning apparatus provided with fin member 60 around cleaning liquid supply tube 40 at penetrating hole 20a of lift pin plate 20. Also, FIG. 12 is a perspective view showing a part of the modified substrate cleaning apparatus as shown in FIG. 11. In FIG. 12, a part of substrate cleaning apparatus is shown in the state that lift pin plate 20 is at the lower position and cleaning liquid supply tube 40 is at the upper position in order to see better fin member 60.

As shown in FIGS. 11 and 12, fin member 60 is provided around cleaning liquid supply tube 40 at penetrating hole 20a of lift pin plate 20. As shown in FIG. 12, fin member 60 is provided with a plurality of fin part 60a extending radially from the center of penetrating hole 20a. Fin member 60 is attached to lift pin plate 20, and also rotates while lift pin plate 20 rotates.

By providing penetrating hole 20a of lift pin plate 20 with fin member 60, a downward air flow is formed from the upper position of lift pin plate 20 toward penetrating hole 20a at penetrating hole 20a of lift pin plate 20 when lift pin plate 20 and fin member 60 rotate. Accordingly, the dust in, for example, the vicinity of rotation driving unit 39 or the bearing at the lower position than penetrating hole 20a can be prevented from moving up through the gap formed between cleaning liquid supply tube 40 and rotation shaft 34, and then being injected above lift pin plate 20 through penetrating hole 20a.

Figure 13:
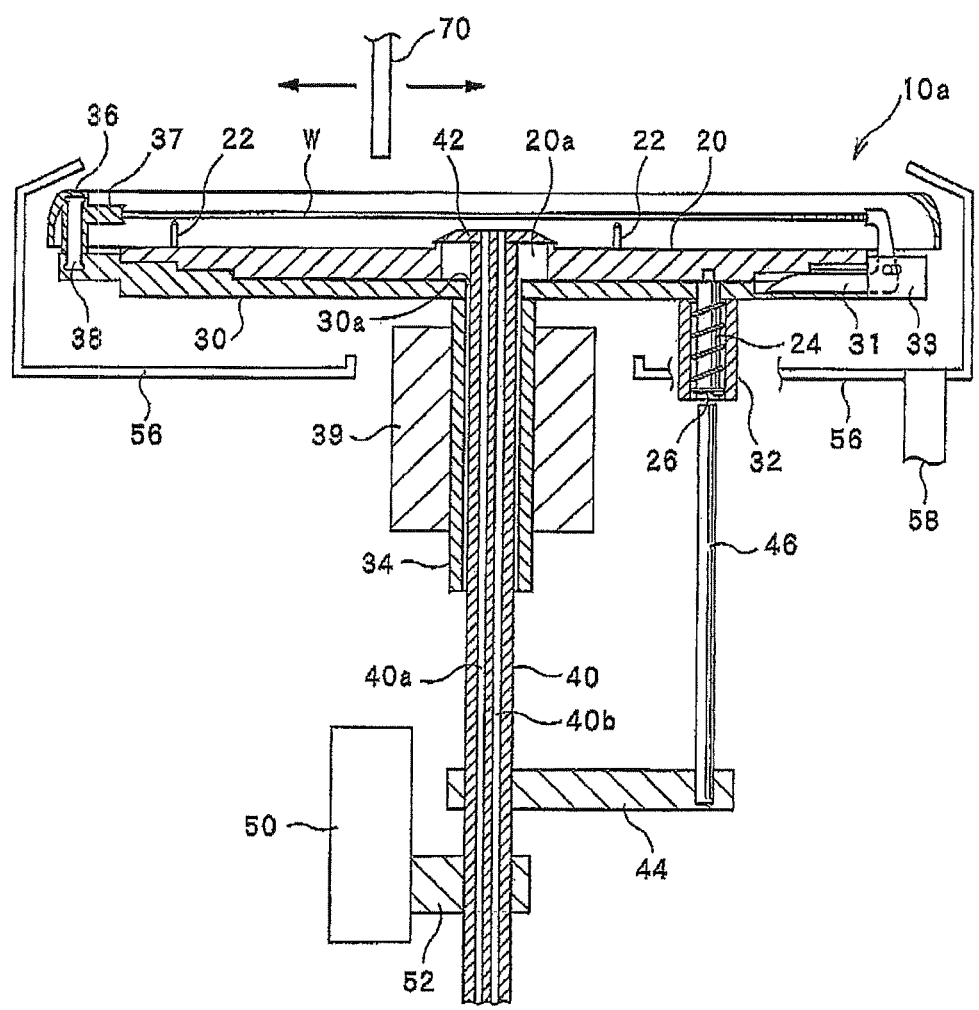
FIG. 13 is a vertical cross-sectional view showing the configuration of yet another substrate cleaning apparatus.

Also, the cleaning liquid does not need to be supplied only to the back surface of wafer W held by holding plate 30, and as shown in FIG. 13, a cleaning liquid supply nozzle 70 may be provided in such a way that the cleaning liquid is supplied to the front surface of wafer W held by holding plate 30. In substrate cleaning apparatus 10a as shown in FIG. 13, cleaning liquid supply nozzle 70 may be configured to be movable in a horizontal direction between the center part and the periphery part of wafer W along the diameter direction of wafer W held by holding plate 30.

Also, the liquid processing apparatus and liquid processing method according to the present disclosure are not limited to the substrate cleaning apparatus and the substrate cleaning method performing cleaning processing of wafer W. The liquid processing apparatus and the liquid processing method according to the present disclosure may be applied to other type of liquid processing of wafer W such as, for example, an etching process of wafer W.

Further, the configuration of the liquid processing apparatus is not limited to the embodiments as discussed above. For example, a liquid cleaning apparatus may have a configuration which includes a holding plate for holding a substrate, a lift pin plate provided above the holding plate and having a lift pin supporting the substrate from a lower direction, a rotation driving portion for rotating the holding plate, and an elevating mechanism for elevating the lift pin plate relatively with respect to the holding plate. In particular, the holding plate is provided with a substrate support portion for supporting the substrate from a side when the lift pin plate is at a lower position, and for being spaced from the substrate when the lift pin plate is at an upper position.

According to such liquid processing apparatus, it is not necessary to provide a driving mechanism for driving a substrate support portion, and it is possible to drive the substrate support portion in coupling with a lift pin plate, by simply allowing an elevating mechanism to elevate a lift pin plate. Thus, compared to the case where both of the elevating mechanism of a lift pin plate and the driving mechanism of a substrate support portion are provided, as disclosed in, for example, Japanese Patent Application Laid-open Publication No. 2009-60063, the present disclosure can achieve a simpler configuration of the liquid processing apparatus. Also, in case both of the elevating mechanism of a lift pin plate and the driving mechanism of a substrate support portion are provided as disclosed in Japanese Paten Application Laid-open Publication No. 2009-60063, there may be a time lag between the elevating timing of a lift pin plate and the moving timing of a substrate support portion. However, according to the liquid processing apparatus as discussed above, since the elevation of the lift pin plate and the movement of the substrate support portion are coupled, the occurrence of such time lag is suppressed and the throughput is improved. Thus, with the liquid processing apparatus as described above, the problem of a conventional liquid processing apparatus requiring a number of driving mechanisms can be solved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
a holding plate, formed with a penetrating hole at the center part thereof, configured to hold a substrate;
a lift pin plate provided above the holding plate, formed with a penetrating hole at the center part thereof, and having a lift pin for supporting the substrate from a lower side;
a rotation-driving unit configured to rotate the holding plate;
a processing liquid supply unit configured to pass through the penetrating hole of the holding plate and the penetrating hole of the lift pin plate, and to supply the processing liquid to the back surface of the substrate held by the holding plate, and have a head part provided to close the penetrating hole of the lift pin plate; and
an elevating mechanism configured to relatively elevate the processing liquid supply unit and the lift pin plate with respect to the holding plate,
wherein the elevating mechanism elevates the processing liquid supply unit and the lift pin plate independently of each other.

2. The liquid processing apparatus according to claim 1, wherein the lift pin plate rotates coupled with the holding plate.

3. The liquid processing apparatus according to claim 1, wherein the lift pin plate is placed adjacent to the holding plate when the lift pin plate is at a lower position, and is spaced upwardly from the holding plate when the lift plate is at an upper position so as to transfer the substrate onto the lift pin and extract the substrate from the lift pin.

4. The liquid processing apparatus according to claim 1, further comprising a rotation cup provided at the holding plate and surrounds the outer circumferential edge of the substrate held by the holding plate when the processing liquid supply unit and the lift pin plate are at the lower position.

5. A liquid processing apparatus comprising:
a holding plate, formed with a penetrating hole at the center part thereof, configured to hold a substrate;
a lift pin plate provided above the holding plate, formed with a penetrating hole at the center part thereof, and having a lift pin for supporting the substrate from a lower side;
a rotation-driving unit configured to rotate the holding plate;
a processing liquid supply unit configured to pass through the penetrating hole of the holding plate and the penetrating hole of the lift pin plate, and to supply the processing liquid to the back surface of the substrate held by the holding plate, and have a head part provided to close the penetrating hole of the lift pin plate; and an elevating mechanism configured to relatively elevate the processing liquid supply unit and the lift pin plate with respect to the holding plate, wherein the holding plate is provided with a substrate support portion configured to support the substrate from a side, the substrate support portion supports the substrate from the side when the lift pin plate is at a lower position and is spaced from the substrate when the lift pin plate is at an upper position, the substrate support portion, being pivotally supported to the holding plate, is configured to swing around a shaft, the substrate support portion has a substrate support part that supports the substrate from the side and a pressed part, being provided between the lift pin plate and the holding plate, to be pressed downwardly by the lower surface of the lift pin plate when the lift pin plate is at the lower position, and the substrate support portion is such that the substrate support portion rotates around the shaft by allowing the lower surface of the lift pin plate to press the pressed part downwardly when the lift pin plate is moved from the upper position to the lower position and the substrate support part pivots from and toward the side of the substrate.

6. The liquid processing apparatus according to claim 5, wherein a shaft receiving portion formed with a bearing hole for receiving the shaft of the substrate support portion is provided at the holding plate, the shaft being capable of moving horizontally along the shaft receiving hole, and a pressing portion configured to press the shaft toward the center of the holding plate is provided at the shaft.

7. The liquid processing apparatus according to claim 6, wherein the pressing portion is a spring member.

8. A liquid processing apparatus comprising:

a holding plate, formed with a penetrating hole at the center part thereof, configured to hold a substrate;

a lift pin plate provided above the holding plate, formed with a penetrating hole at the center part thereof, and having a lift pin for supporting the substrate from a lower side;

a rotation-driving unit configured to rotate the holding plate;

a processing liquid supply unit configured to pass through the penetrating hole of the holding plate and the penetrating hole of the lift pin plate, and to supply the processing liquid to the back surface of the substrate held by the holding plate, and have a head part provided to close the penetrating hole of the lift pin plate; and an elevating mechanism configured to relatively elevate the processing liquid supply unit and the lift pin plate with respect to the holding plate, wherein the lower surface of the lift pin plate is provided with a connecting member extended downwardly from the lift pin plate, the holding plate is provided with a penetrating hole for the connecting member through which the connecting member is passed, the lift pin plate and the holding plate rotate coupled with the connecting member, and the elevating mechanism elevates the connecting member upwardly when the lift pin plate is moved from the lower position to the upper position.

9. The liquid processing apparatus according to claim 8, wherein a hollow hosing member, being extended downwardly from the holding plate, is provided for accommodating the connecting member at the lower surface of the holding plate, and a spring connected to the connecting member is accommodated with a state being pressed at a hollow area of the housing member, and the connecting member is biased downwardly by the spring.

10. The liquid processing apparatus according to claim 5, wherein the lift pin plate rotates coupled with the holding plate.

11. The liquid processing apparatus according to claim 5, wherein the elevating mechanism elevates the processing liquid supply unit and the lift pin plate integrally.

12. The liquid processing apparatus according to claim 5, wherein the elevating mechanism elevates the processing liquid supply unit and the lift pin plate independently of each other.

13. The liquid processing apparatus according to claim 5, wherein the lift pin plate is placed adjacent to the holding plate when the lift pin plate is at a lower position, and is spaced upwardly from the holding plate when the lift plate is at an upper position so as to transfer the substrate onto the lift pin and extract the substrate from the lift pin.

14. The liquid processing apparatus according to claim 5, further comprising a rotation cup provided at the holding plate and surrounds the outer circumferential edge of the substrate held by the holding plate when the processing liquid supply unit and the lift pin plate are at the lower position.

\* \* \* \* \*